United States Patent [19]

Tsuchiya et al.

[11] 4,374,346
[45] Feb. 15, 1983

[54] VOLTAGE DETECTION CIRCUITS FOR A-C POWER SUPPLIES

[75] Inventors: Takuichi Tsuchiya; Hiroshi Togo, both of Tokyo, Japan

[73] Assignee: Nippon Electric Co., Ltd., Tokyo, Japan

[21] Appl. No.: 123,828

[22] Filed: Feb. 22, 1980

[30] Foreign Application Priority Data

Feb. 27, 1979 [JP] Japan .................. 54-22118

[51] Int. Cl.³ .................. H05B 41/16; H05B 41/24
[52] U.S. Cl. .................. 315/276; 307/350;
315/3.5; 324/102; 328/165; 363/39; 363/45
[58] Field of Search .............. 328/146, 149, 160, 166,
328/173, 165; 307/350, 351; 363/39, 44, 45, 46,
61, 74; 324/102; 323/226, 227, 220, 286, 287;
315/276, 35

[56] References Cited

U.S. PATENT DOCUMENTS

| | | | |
|---|---|---|---|
| 2,954,522 | 9/1960 | Dickey et al. | 324/102 X |
| 3,182,247 | 5/1965 | Loucks | 363/46 X |
| 3,353,080 | 11/1967 | Santelmann, Jr. | 363/45 |
| 4,042,871 | 8/1977 | Grubbs et al. | 363/61 |
| 4,142,241 | 2/1979 | Freilick et al. | 363/44 |
| 4,176,310 | 11/1979 | Elenga et al. | 363/39 |
| 4,225,794 | 9/1980 | Buff | 328/160 |

Primary Examiner—Saxfield Chatmon, Jr.
Attorney, Agent, or Firm—Laff, Whitesel, Conte & Saret

[57] ABSTRACT

A power supply control circuit is especially useful for a traveling wave tube, although it may also be used anyplace where desirable. An a-c power voltage is supplied to an input of the control circuit, where its frequency is multiplied to become a voltage having a period which is no greater than the duration of a power voltage fluctuation which might damage the traveling wave tube, unless corrected. The wave form of the multiplied frequency is shaped to provide a comparison voltage wave form, which is compared with a reference voltage. The a-c power voltage applied to said traveling wave tube is controlled responsive to the output of the comparison means.

12 Claims, 1 Drawing Figure

VOLTAGE DETECTION CIRCUIT 25

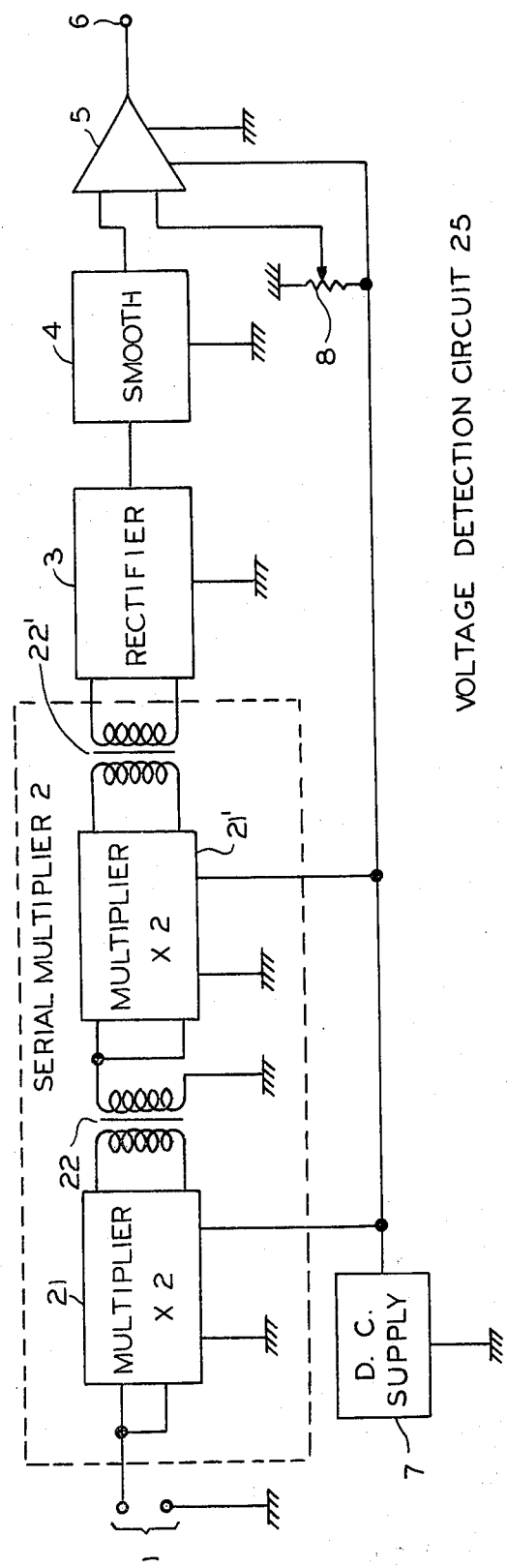

VOLTAGE DETECTION CIRCUITS FOR A-C POWER SUPPLIES

This invention relates to circuits for detecting undesired voltage fluctuations arising in a-c power supplies, as, for example, fluctuations due to current stoppage, etc.

Coventional voltage detection circuits for a-c signals have heretofore been designed so that input a-c signals may be detected and smoothed. Generally, the smoothed a-c signals are compared with a reference voltage by means of a voltage comparator, to detect undesired voltage changes in the input signal. This conventional design is defective in that the detection response speed is inevitably restricted by the time constant of the smoothing circuit. Also, there is a high-value time constant in the circuit which makes it difficult to detect voltage changes, at a high speed.

Therefore, an object of this invention is to provide voltage detection circuits for a-c power supplies. Here, an object is to provide such a detection circuit which is capable of high-speed detection of undesired voltage changes in the input signal.

According to the present invention, a voltage detection circuit for an a-c power supply multiplies the frequency of the voltage received from the a-c power supply. The output of the frequency-multiplying means is rectified and smoothed. A voltage comparison means compares the smoothed output voltage with a predetermined reference voltage and supplies the resulting comparison at the output of the voltage detection circuit.

The invention will now be described in further detail with reference to the accompanying single FIGURE of the drawing, which diagrammatically shows an embodiment of the invention.

The FIGURE shows a fast-acting circuit for monitoring the output of an a-c power source.

Input terminals 1 are connected to a serial multiplier 2 comprising a pair of frequency multipliers 21,21' having individually associated output transformers 22,22'. The second output transformer is connected through a rectifier 3 and smoothing circuit 4 to an input of a voltage comparator 5. A reference voltage source 7 is connected to the other input of the comparator 5 via an adjustable rheostat 8. The output voltage is taken from the output terminal 6 of the voltage comparator.

An a-c input signal received at the input terminals 1 is supplied to an input terminal and a multiplicand input terminal of a multiplier 21. Assume that the input a-c signal is expressed as cos $\omega t$, then, at its output terminal, the multiplier 21 emits an output signal expressed by the formula:

$$\cos^2 \omega t = K_1 \tfrac{1}{2}(1 + \cos^2 \omega t) \qquad (1)$$

where $K_1$ is a scale factor of the multiplier 21.

The output of the multiplier 21 contains a frequency component which is twice the frequency of the a-c input signal, and which is extracted by a transformer 22. Further, a component having a frequency which is quadruple that of the a-c input signal is extracted through a second multiplier 21' and a transformer 22'. Subsequently, the a-c component is rectified by rectifier 3, and smoothed by smoothing circuit 4 to provide a shaped wave form which may be used as a comparison voltage wave form. The voltage comparator 5 compares the smoothed output with a reference voltage given through a rheostat 8. The result of the comparison is brought to the output terminal 6 of the voltage detection circuit 25.

Since the output frequency component of the serial multiplier circuit 2 is quadruple that of the a-c input signal, the time constant of the smoothing circuit 4 is $\tfrac{1}{4}$ that of the conventional circuit system in which the a-c input signal is simply detected and smoothed. Accordingly, with the circuit of the invention, it is possible to detect any abnormal rise or fall of the voltage of the a-c input signal within $\tfrac{1}{4}$ of the time required for such detection by the conventional system.

Normally, in the standard operations of a travelling wave tube (TWT), damage to the TWT can be avoided only if dangerous fluctuation in the input a-c power supply can be detected rapidly and the power source can be shut down within a $\tfrac{1}{4}$ cycle after the danger condition occurs. Accordingly, the invention uses a detection circuit incorporating a quadruple multiplier in the detection circuit for shutting down the a-c power supply. However, it is possible to arrange for the serial multiplication circuit to increase the frequency n times (where n is an integer greater than 2) in order to reduce the detection time to $\tfrac{1}{2}n$.

In other words, if the serial multiplier circuit 2 is an n-times type, there can be an output frequency component of cos $2^n \omega t$. Accordingly, the smoothing circuit 4 can have a time constant which is as small as $\tfrac{1}{2}n$ of the time constant used in the ordinary system. Advantageously, the result is an increase of the abnormality detecting speed for the input a-c signal, by $2^n$ times as compared with the detecting speed obtainable in the ordinary system.

Further, assume that the constant $K_1$ in the foregoing formula (1) is "2," the amplitude of the input a-c is "1," and its variation component is "a." Then, the amplitude is increased by $(1-\alpha)^{2(n-1)}$ times, after the frequency multiplication. Hence, there is an improved sensitivity for detecting changes in the input signal. Although the multiplication factor n may be any integer equal to or greater than 2, relevant experiments have indicated better performance when a quadruple multiplier, of the type shown is used, as compared to other tested types.

The stabilized d-c source 7 supplies a d-c voltage to the voltage comparator 5 and to the multipliers 21 and 21'. The rheostat 8 may be adjusted to give a reference voltage to the comparator 5, by suitably dividing the output voltage of the source 7. Alternatively, a Zener diode, or the like (not shown), may be used to supply a stable and regulated voltage. Also, the frequency multiplier circuit 2 may use diodes, depending on the condition of the input signal which is to be detected. Moreover, the d-c voltage may also be obtained by rectifying and smoothing only a part of the input a-c signal.

As is apparent from the foregoing, the invention is advantageous since the time constant of the smoothing circuit can be reduced to raise the detection sensitivity. The time required to detect undesired voltage fluctuations of an input a-c signal can be shortened. Therefore, the inventive circuit is capable of a high-speed detection of voltage drops in an input a-c power source, such as the source for a power amplifier, or the like, for driving a traveling wave tube. Hence, the invention provides means for preventing damage to traveling wave tubes which might otherwise occur due to abnormal voltages applied thereto.

Reference is made to a co-pending application entitled "Circuit for Protecting Traveling-Wave Tubes Against Faults of a Power Supply" by Teruhisa Kurokawa, inventor, Ser. No. 123827, filed Feb. 22, 1980, now U.S. Pat. No. 4,323,853 (corresponds to Japanese application No. 21144/79). Terminal 6 in this application corresponds to terminal 4 in that application.

Those who are skilled in the art will readily perceive how to modify the system. Therefore, the appended claims are to be construed to cover all equivalent structures which fall within the true scope and spirit of the invention.

What is claimed is:

1. A voltage detection circuit for an a-c power supply for a traveling wave tube, said voltage detection circuit comprising means for frequency-multiplying an a-c signal from said a-c power supply, means for rectifying the output of said frequency-multiplying means, means for smoothing the output of said rectifying means, and voltage comparison means for comparing the output voltage of said smoothing means with a predetermined reference voltage to provide a control signal responsive to the comparison at the output of said detection circuit.

2. The voltage detection circuit of claim 1, wherein said frequency-multiplying means comprises multiplier means for multiplying said a-c signal and transformer means for transferring an a-c component from the output of said multiplier means to said rectifying means.

3. A method of controlling electrical a-c power supplies which supply an a-c output having a predetermined frequency for a traveling wave tube, said method comprising the steps of:
   a. receiving the a-c output;
   b. multiplying the frequency of said received a-c output to provide a signal having a frequency which is higher than said predetermined frequency;
   c. converting said multiplied frequency to a control voltage signal having amplitude fluctuations corresponding to fluctuations in the a-c output;
   d. comparing the voltage of said control voltage signal with a reference voltage; and
   e. signalling differences exceeding a predetermined level responsive to said comparison.

4. The method of claim 3 and the added step of adjusting the level of said reference voltage to establish said predetermined frequency.

5. The method of claim 3 or claim 4 wherein said higher frequency is four times the predetermined frequency.

6. The method of claim 3 or claim 4 wherein said higher frequency is N times the predetermined frequency.

7. The method of claim 3 or claim 4 wherein said higher frequency is described by the formula $(K/2)(1+\cos^2 \omega t)$, where: $\cos \omega t$ is the a-c output, and K is a constant representing the scale by which said predetermined frequency is multiplied.

8. The method of claim 3 or claim 4 and the added step of transferring said multiplied frequency signal for conversion in step c.

9. The method of claim 3 or claim 4 wherein said higher frequency is high enough relative to said predetermined frequency to prevent damage to a traveling wave tube when said a-c voltage is used as the power supply for said tube.

10. A power supply control circuit for a traveling wave tube, said circuit comprising means for supplying an a-c input signal to an input of said control circuit, means in said control circuit responsive to said a-c input signal for multiplying the frequency of said a-c input to provide a signal having a frequency which is no lower than the frequency of a power voltage fluctuation which may damage said traveling wave tube, means for shaping said multiplied frequency to provide a comparison voltage wave form, means for comparing said comparison wave form with a reference voltage, and means responsive to said comparing means for giving a signal to control an a-c power voltage applied to said traveling wave tube.

11. The control circuit of claim 10 and means associated with said frequency multiplying means for transferring a particular component from said multiplied frequency to said wave-shaping means.

12. The control circuit of claim 10 or of claim 11 and means for adjusting the level of said reference voltage.

* * * * *